(12) United States Patent
Huang et al.

(10) Patent No.: US 9,165,822 B2
(45) Date of Patent: Oct. 20, 2015

(54) SEMICONDUCTOR DEVICES AND METHODS OF FORMING SAME

(71) Applicant: Taiwan Semiconductor Manufacturing Company, Ltd., Hsin-Chu (TW)

(72) Inventors: Hsin-Yen Huang, Yonghe (TW); Chi-Lin Teng, Taichung (TW); Hai-Ching Chen, Hsin-Chu (TW); Tien-I Bao, Dayuan Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 22 days.

(21) Appl. No.: 13/874,893

(22) Filed: May 1, 2013

(65) Prior Publication Data
US 2014/0252624 A1    Sep. 11, 2014

Related U.S. Application Data

(60) Provisional application No. 61/776,661, filed on Mar. 11, 2013.

(51) Int. Cl.
*H01L 21/4763* (2006.01)
*H01L 21/768* (2006.01)
*H01L 23/532* (2006.01)

(52) U.S. Cl.
CPC .... *H01L 21/76832* (2013.01); *H01L 21/76834* (2013.01); *H01L 21/76835* (2013.01);
(Continued)

(58) Field of Classification Search
CPC ............... H01L 21/76841; H01L 23/53223; H01L 23/5329; H01L 23/53295

USPC ......... 438/689, 737, 758, 761, 618, 622, 627, 438/634, 680, 688, 687, 706; 257/211, 635, 257/758, E21.579, E23.142, E21.021
See application file for complete search history.

(56) References Cited

U.S. PATENT DOCUMENTS 5,847,443 A * 12/1998 Cho et al. ...................... 257/632
6,331,481 B1 * 12/2001 Stamper et al. ............... 438/626
(Continued)

FOREIGN PATENT DOCUMENTS

| KR | 408369 | 10/2000 |
| KR | 200913059 | 3/2009 |
| KR | 200949931 | 12/2009 |

OTHER PUBLICATIONS

Ma et al. Structural and electronic properties of low dielectric constant flluorinated amorphous carbon films. Applied Physics Latters, vol. 72, Nov. 25, 1998, pp. 3353-3355.*

*Primary Examiner* — Galina Yushina
(74) *Attorney, Agent, or Firm* — Slater & Matsil, L.L.P.

(57)  ABSTRACT

A semiconductor device structure and methods of forming the same are disclosed. An embodiment is a method of forming a semiconductor device, the method comprising forming a first conductive line over a substrate, and conformally forming a first dielectric layer over a top surface and a sidewall of the first conductive line, the first dielectric layer having a first porosity percentage and a first carbon concentration. The method further comprises forming a second dielectric layer on the first dielectric layer, the second dielectric layer having a second porosity percentage and a second carbon concentration, the second porosity percentage being different from the first porosity percentage, and the second carbon concentration being less than the first carbon concentration.

20 Claims, 10 Drawing Sheets

(52) U.S. Cl.
CPC ...... *H01L21/76885* (2013.01); *H01L 23/5329* (2013.01); *H01L 23/53223* (2013.01); *H01L 23/53238* (2013.01)

(56) References Cited

U.S. PATENT DOCUMENTS

| | | | | |
|---|---|---|---|---|
| 6,743,471 B2* | 6/2004 | Ko et al. | | 427/226 |
| 7,459,391 B2* | 12/2008 | Yoshizawa et al. | | 438/638 |
| 8,623,758 B1* | 1/2014 | Ryan et al. | | 438/627 |
| 2005/0098896 A1* | 5/2005 | Huang et al. | | 257/760 |
| 2006/0244034 A1* | 11/2006 | Sakurai et al. | | 257/310 |
| 2007/0158178 A1* | 7/2007 | Leybovich | | 204/192.1 |
| 2007/0278682 A1* | 12/2007 | Ko et al. | | 257/758 |
| 2009/0246951 A1* | 10/2009 | Feustel et al. | | 438/637 |
| 2010/0102454 A1* | 4/2010 | Akiyama | | 257/774 |
| 2010/0240220 A1* | 9/2010 | Chiu et al. | | 438/714 |
| 2011/0027989 A1* | 2/2011 | Mayer et al. | | 438/666 |
| 2011/0308937 A1* | 12/2011 | Haas et al. | | 204/192.15 |
| 2012/0074535 A1* | 3/2012 | Huang et al. | | 257/632 |
| 2012/0313256 A1* | 12/2012 | Lu et al. | | 257/774 |

\* cited by examiner

SEMICONDUCTOR DEVICES AND METHODS OF FORMING SAME

This application claims the benefit of U.S. Provisional Application No. 61/776,661, filed on Mar. 11, 2013, entitled "Semiconductor Devices and Methods of Forming Same," which application is hereby incorporated herein by reference.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

Conductive materials such as metals or semiconductors are used in semiconductor devices for making electrical connections for the integrated circuits. For many years, aluminum was used as a metal for conductive materials for electrical connections, and silicon dioxide was used as an insulator. However, as devices are decreased in size, the materials for conductors and insulators have changed, to improve device performance.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Semiconductor devices and methods of forming the same are provided in accordance with various embodiments. The intermediate stages of forming the semiconductor devices are illustrated. Some variations of the embodiments are discussed. Throughout the various views and illustrative embodiments, like reference numbers are used to designate like elements. Although method embodiments are discussed in a particular order, various other method embodiments may be performed in any logical order and may include fewer or more steps described herein.

Figure 10:
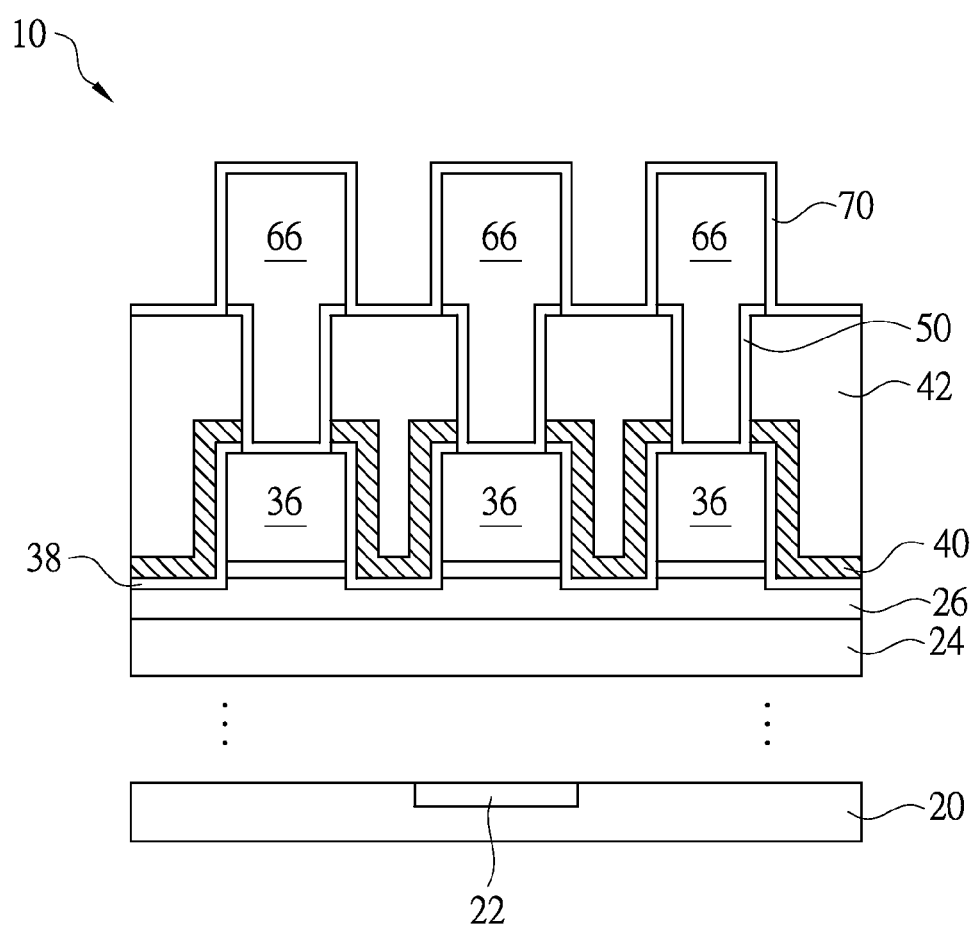
Figure 11:
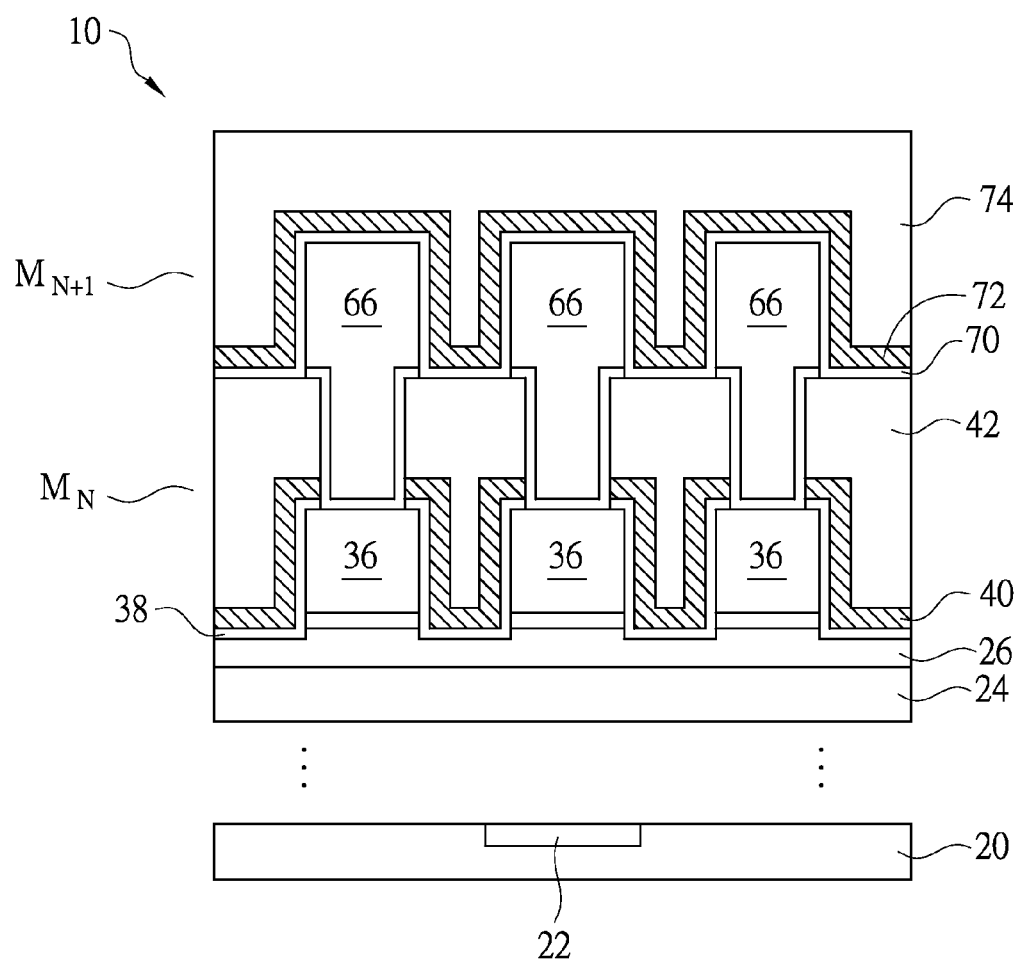
Figure 12:
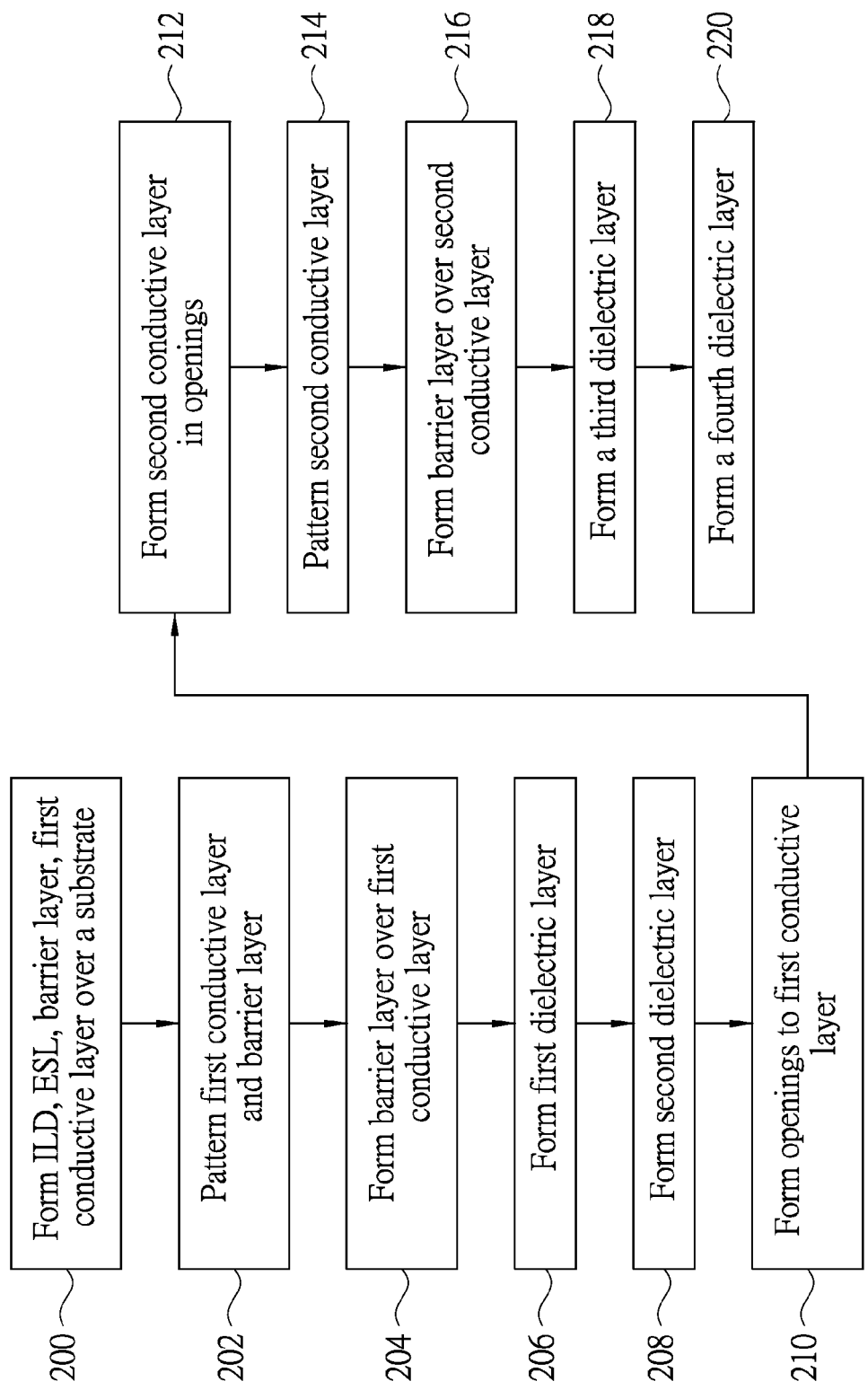
FIG. 12 is a process flow diagram of the process shown in FIGS. 1 through 11 in accordance with an embodiment.

FIGS. 1 through 11 are cross-sectional views of intermediate stages in the manufacturing of a semiconductor device in accordance with an embodiment, and FIG. 12 is a process flow of the process shown in FIGS. 1 through 11.

Figure 1:
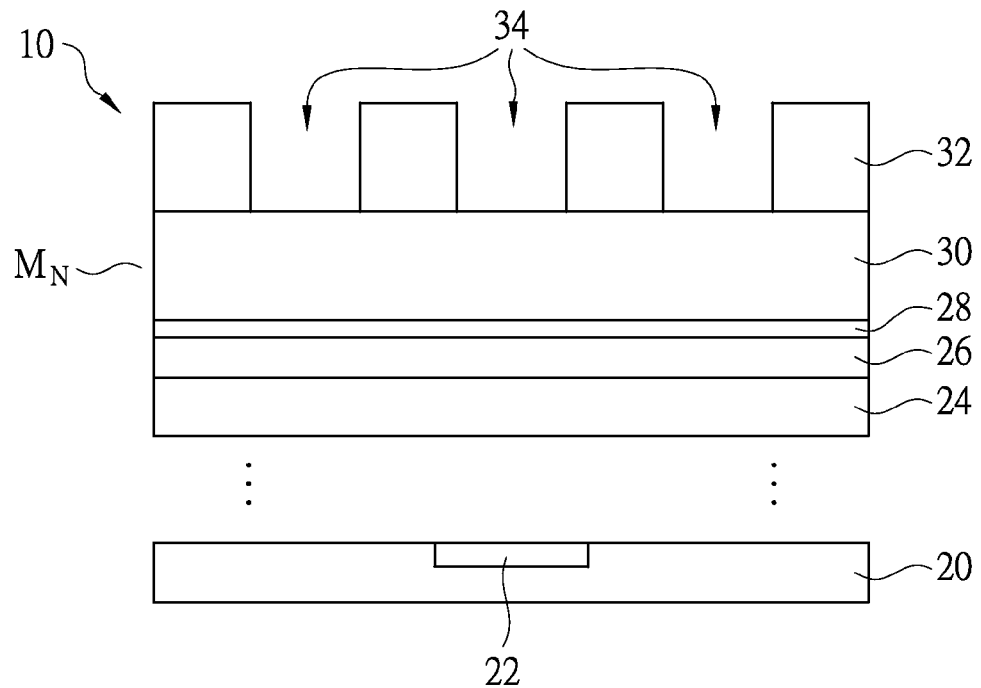
FIGS. 1 through 11 are cross-sectional vies of intermediate stages in the manufacturing of a semiconductor device in accordance with an embodiment.

With reference now to FIG. 1, there is shown a semiconductor device 10 at an intermediate stage of processing according to an embodiment. The semiconductor device 10 includes a substrate 20, which may be a part of a wafer. Substrate 20 may comprise a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 20 may comprise a silicon-on-insulator (SOI) substrate. Generally, an SOI substrate comprises a layer of a semiconductor material such as epitaxial silicon, germanium, silicon germanium, SOI, silicon germanium on insulator (SGOI), or combinations thereof. The substrate 20 may be doped with a p-type dopant, such as boron, aluminum, gallium, or the like, although the substrate may alternatively be doped with an n-type dopant, as is known in the art.

The substrate 20 may include active and passive devices 22. As one of ordinary skill in the art will recognize, a wide variety of devices such as transistors, capacitors, resistors, combinations of these, and the like may be used to generate the structural and functional requirements of the design for the semiconductor device 10. The active and passive devices 22 may be formed using any suitable methods. Only a portion of the substrate 20 is illustrated in the figures, as this is sufficient to fully describe the illustrative embodiments.

An interlayer dielectric (ILD) 24, an etch stop layer (ESL) 26, a barrier layer 28, and a conductive layer 30 may be formed over the substrate 20 (step 200). The ILD 24 may be formed over the substrate 20. The ILD 24 may be formed of oxides such as silicon oxide, borophosphosilicate glass (BPSG), undoped silicate glass (USG), fluorinated silicate glass (FSG), low-k dielectrics such as carbon doped oxides, extremely low-k dielectrics such as porous carbon doped silicon dioxide, a polymer such as polyimide, the like, or a combination thereof. The low-k dielectric materials may have k values lower than 3.9. The ILD 24 may be deposited by chemical vapor deposition (CVD), physical vapor deposition (PVD), atomic layer deposition (ALD), a spin-on-dielectric (SOD) process, the like, or a combination thereof. In an embodiment, the ILD 24 may be formed directly on a top surface of the substrate 20. In other embodiments, the ILD 24 may be formed on intermediate layers and/or structures (not shown) which are on substrate 20.

The ESL 26 may be deposited on the ILD 24. The ESL 26 may act as an etch stop layer for the subsequent patterning of the conductive layer 30 (see FIG. 2). The ESL 26 may be made of one or more suitable dielectric materials such as silicon oxide, silicon carbide, oxygen doped silicon carbide, nitrogen doped silicon carbide, silicon nitride, aluminum oxide, aluminum nitride, aluminum oxynitride, combinations of these, or the like. The ESL 26 may be deposited through a process such as CVD, an SOD process, although any acceptable process may be utilized to form the ESL 26 to a thickness from about 5 Å to about 200 Å.

A barrier layer 28 may be formed on the ESL 26. The barrier layer 28 may help to block diffusion of the subsequently formed conductive layer 30 into adjacent dielectric materials. The barrier layer 28 may comprise titanium, titanium nitride, tantalum, tantalum nitride, manganese, manganese oxide, cobalt, cobalt oxide, cobalt nitride, nickel, nickel oxide, nickel nitride, silicon carbide, oxygen doped silicon carbide, nitrogen doped silicon carbide, silicon nitride, aluminum oxide, aluminum nitride, aluminum oxynitride, a polymer such as polyimide, polybenzoxazole (PBO) the like, or a combination thereof. The barrier layer 28 may be formed by CVD, PVD, plasma enhanced CVD (PECVD), ALD, SOD, the like, or a combination thereof to a thickness from about 5 Å to about 200 Å. In some embodiments, the barrier layer 28 may be omitted.

The conductive layer 30 may be formed on the barrier layer 28. The conductive layer 30 may also be referred to as a metal layer $M_N$ and may be the first metal layer ($M_1$) over the substrate or may any number metal layer over the substrate (e.g. $M_5$, $M_{10}$, $M_{100}$). The conductive layer 30 may comprise copper, aluminum, the like, or a combination thereof. The conductive layer 30 may be formed through a deposition process such as electrochemical plating, CVD, PVD, the like, or a combination thereof. In some embodiments, the conductive layer 30 may be formed on a seed layer, such as a titanium copper alloy. In an embodiment, the conductive layer 30 may be formed to a thickness from about 100 Å to about 3000 Å.

Figure 2:
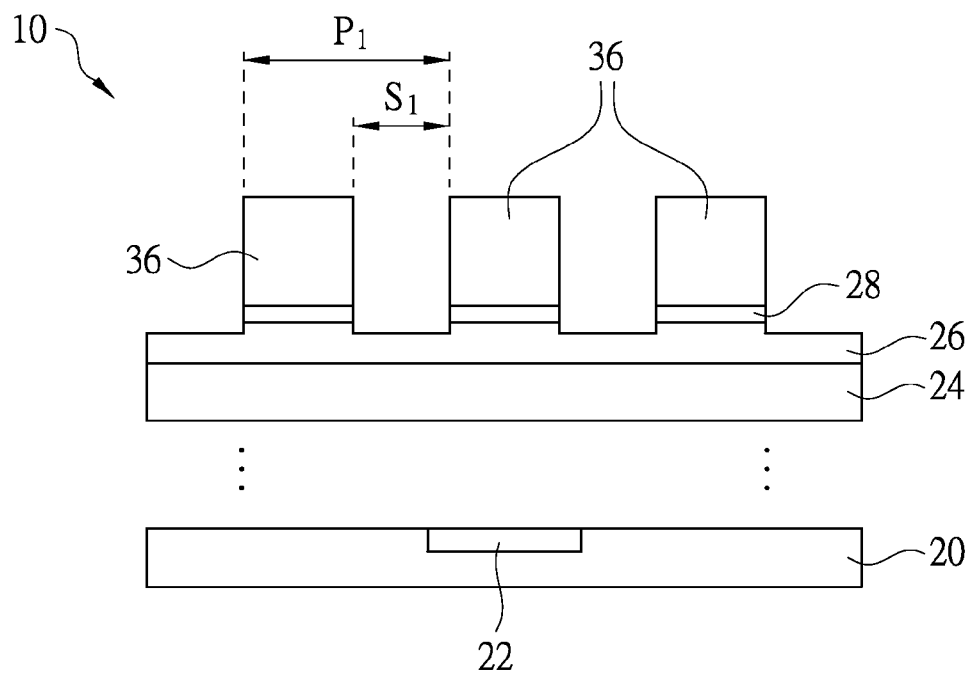

After conductive layer 30 is formed, the conductive layer 30 and the barrier layer 28 may be patterned (step 202) as illustrated in FIGS. 1 and 2. As illustrated in FIG. 1, a photoresist 32 may be deposited and patterned over the conductive layer 30. The photoresist 32 may comprise a conventional photoresist material, such as a deep ultra-violet (DUV) photoresist, and may be deposited on the surface of the conductive layer 30, for example, by using a spin-on process to place the photoresist 32. However, any other suitable material or method of forming or placing the photoresist 32 may alternatively be utilized. Once the photoresist 32 has been placed on the conductive layer 30, the photoresist 32 may be exposed to energy, e.g. light, through a patterned reticle in order to induce a reaction in those portions of the photoresist 32 exposed to the energy. The photoresist 32 may then be developed, and portions of the photoresist 32 may be removed forming openings 34, exposing a surface of conductive layer 30 through the openings 34.

After the photoresist 32 is patterned, the conductive layer 30 and the barrier layer 28 may be patterned to expose a top surface of the ESL 26. The patterning of the conductive layer 30 forms conductive lines 36. The conductive lines 36 may have a spacing $S_1$ between adjacent conductive lines 36 in a range from 5 nm to about 50 nm and a pitch $P_1$, which is the spacing $S_1$ in addition to a conductive line 36 width, in a range from about 10 nm to about 100 nm. In an embodiment, the patterning may be performed by a dry etch process with a plasma source and an etchant gas such as $H_2$, $NH_3$, Ar, He, the like, or a combination thereof. In some embodiments, the conductive lines 36 may be planarized by a chemical mechanical polish (CMP) process or an etching process. Although FIG. 2 illustrates three conductive lines 36, there may be more or less conductive lines 36 depending on the number of conductive lines 36 that are desired.

Figure 3:
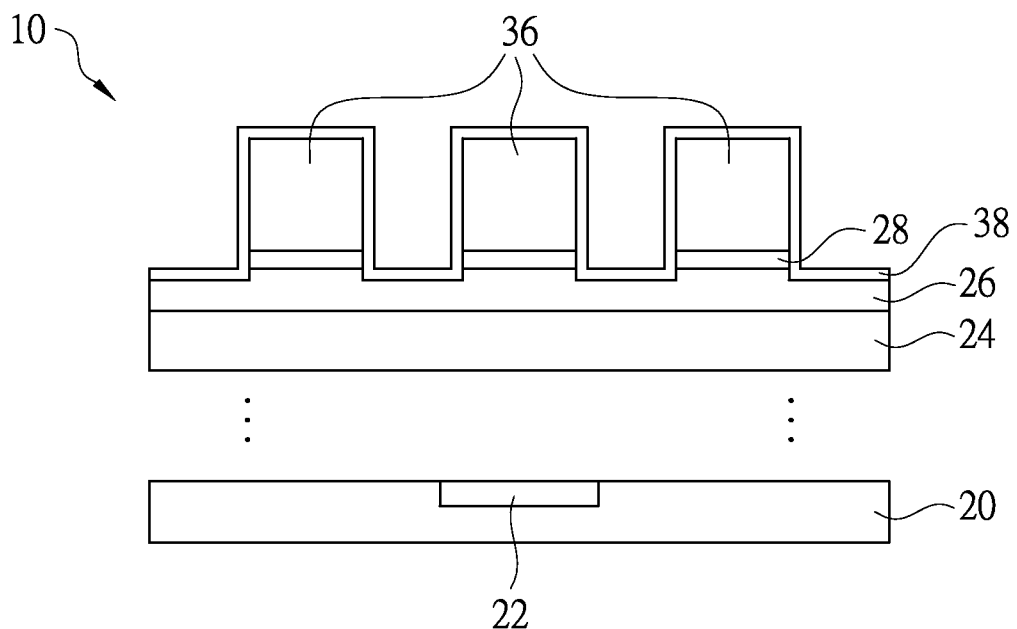

After the conductive lines 36 are formed, a barrier layer 38 may be formed on top surfaces and sidewalls of the conductive lines 36 and the top surface of the ESL 26 (step 204) as illustrated in FIG. 3. The barrier layer 38 may help to block diffusion of the conductive lines 36 into adjacent dielectric materials, such as the subsequently formed first and second dielectric layers 40 and 42 (see FIG. 5). The barrier layer 38 may comprise titanium, titanium nitride, tantalum, tantalum nitride, manganese, manganese oxide, cobalt, cobalt oxide, cobalt nitride, nickel, nickel oxide, nickel nitride, silicon carbide, oxygen doped silicon carbide, nitrogen doped silicon carbide, silicon nitride, aluminum oxide, aluminum nitride, aluminum oxynitride, a polymer such as polyimide, PBO, the like, or a combination thereof. The barrier layer 38 may be conformally deposited by CVD, PVD, PECVD, ALD, SOD, the like, or a combination thereof to a thickness from about 5 Å to about 200 Å. In some embodiments, the barrier layer 38 adjoins a sidewall of the barrier layer 28 under the conductive lines 36.

Figure 4:
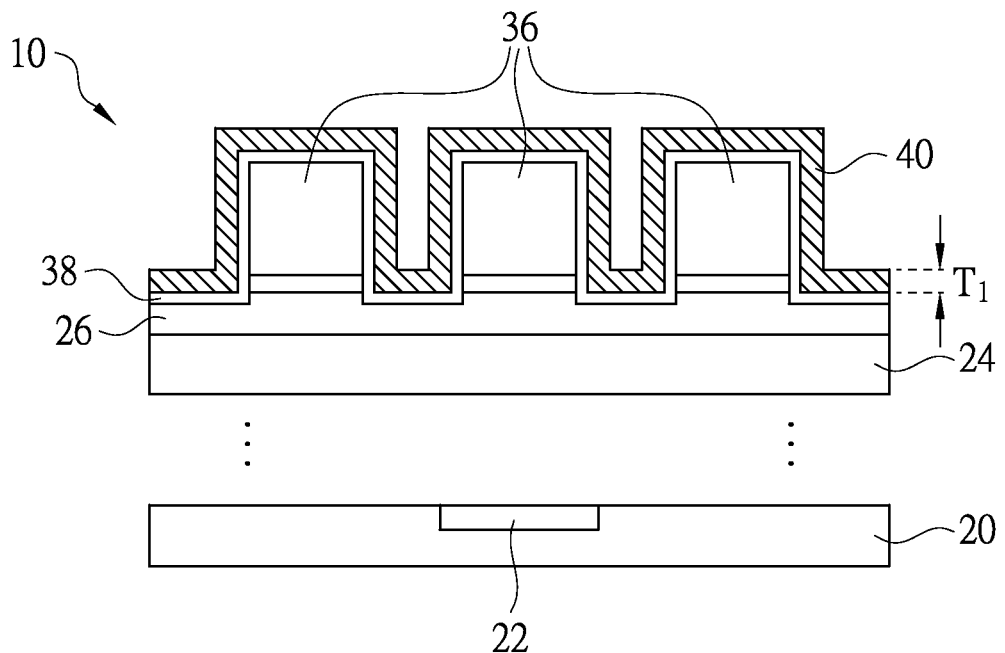

After the barrier layer 38 is formed, the first dielectric layer 40 may be formed on the barrier layer 38 (step 206) as illustrated in FIG. 4. The first dielectric layer 40 may help to block the diffusion of the conductive line 36 into the subsequently formed second dielectric layer 42. Further, the first dielectric layer 40 may have a lower etch rate to assist in etch control. In some embodiments, the first dielectric layer 40 may be conformally deposited over the conductive lines 36 and the barrier layer 38 to have a thickness $T_1$ from about 1 Å to about 45 Å. The first dielectric layer 40 may comprise silicon oxide doped with carbon to a carbon concentration from about 10% to about 40%. The first dielectric layer 40 may have a pore size from about 3 Å to about 20 Å with a porosity from about 5% to about 50% and a k value from about 2.2 to about 2.9. The first dielectric layer 40 may be formed by CVD, ALD, the like, or a combination thereof.

Figure 5:
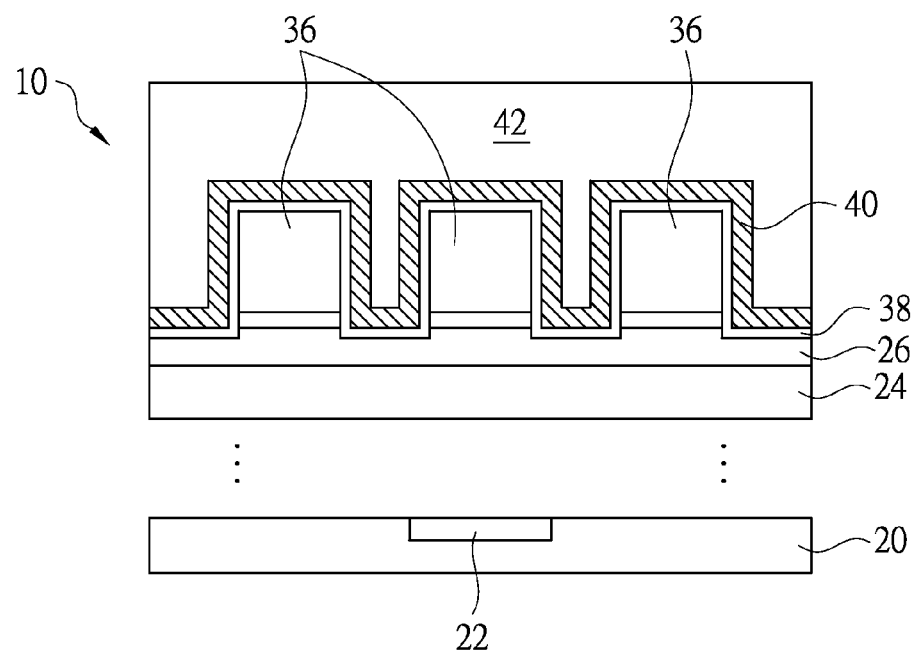

After the first dielectric layer 40 is formed, the second dielectric layer 42 may be formed on the first dielectric layer 40 (step 208) as illustrate in FIG. 5. The second dielectric layer 42 may help to fill gaps between the conductive lines 36 and prevent air gaps in the dielectric layers. The second dielectric layer 42 may comprise silicon oxide doped with carbon to a carbon concentration from about 1% to about 20%. The second dielectric layer 42 may have a pore size from about 10 Å to about 40 Å with a porosity from about 15% to about 70% and may have a k value from about 1.8 to about 2.4. The second dielectric layer 40 may be formed by a spin-on process such as CVD, SOD, the like, or a combination thereof.

The first and second dielectric layers 40 and 42 create a hybrid extreme low-k dielectric (XLK) scheme to forming a dielectric material over the conductive lines. The first dielectric layer 40 being deposited by CVD allows for a smaller pore size to help prevent diffusion of the conductive lines 36, and the second dielectric layer 42 has better gap filling properties to help prevent air gaps in the dielectric layers. Thus, the hybrid XLK scheme may allow for a lower effective k value while also preventing integration issues as the feature sizes continue to get smaller.

After the second dielectric layer 42 is formed, another conductive layer $M_{N+1}$ (see FIG. 8) may be formed over the conductive layer $M_N$. The formation of the next metal layer may begin with the forming of openings extending through the first and second dielectric layers 40 and 42 to expose top surfaces of the conductive lines 36 (step 210) as illustrated in FIGS. 6 and 7.

Figure 6:
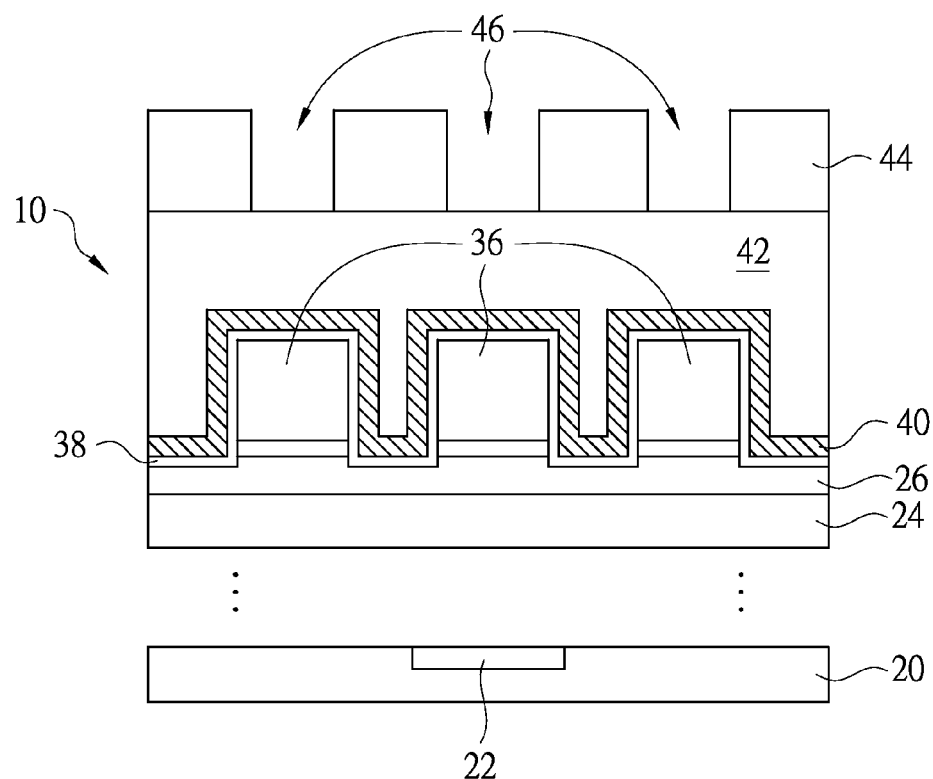

As illustrated in FIG. 6, a photoresist 44 may be deposited and patterned over the second dielectric layer 42 to form openings 46 exposing portions of the second dielectric layer 42 in the openings 46. The photoresist 44 may be formed and patterned similar to the photoresist 32 as described above and the description will not be repeated herein.

Figure 7:
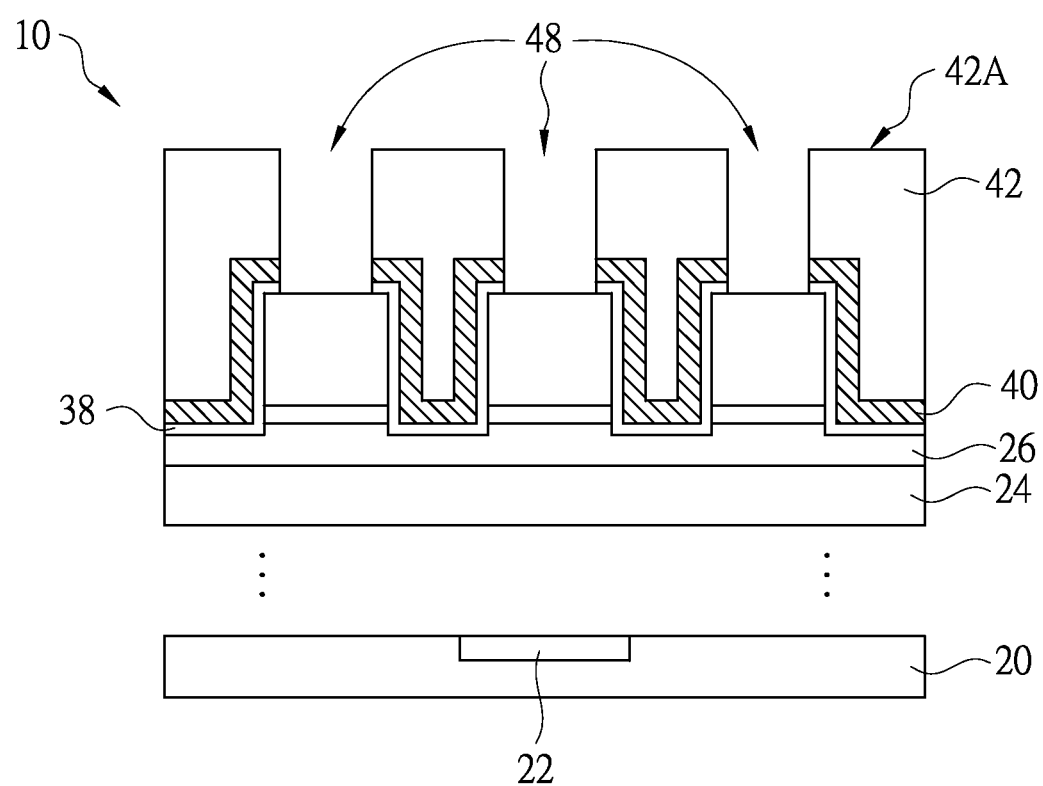

FIG. 7 illustrates the formation of the openings 48 through the second dielectric layer 42 and the first dielectric layer 40 to expose top surfaces of the conductive lines 36 (step 212). The openings 48 may be formed by may be patterned using acceptable photolithography and etching techniques such as, for example, an anisotropic dry etch.

Figure 8:
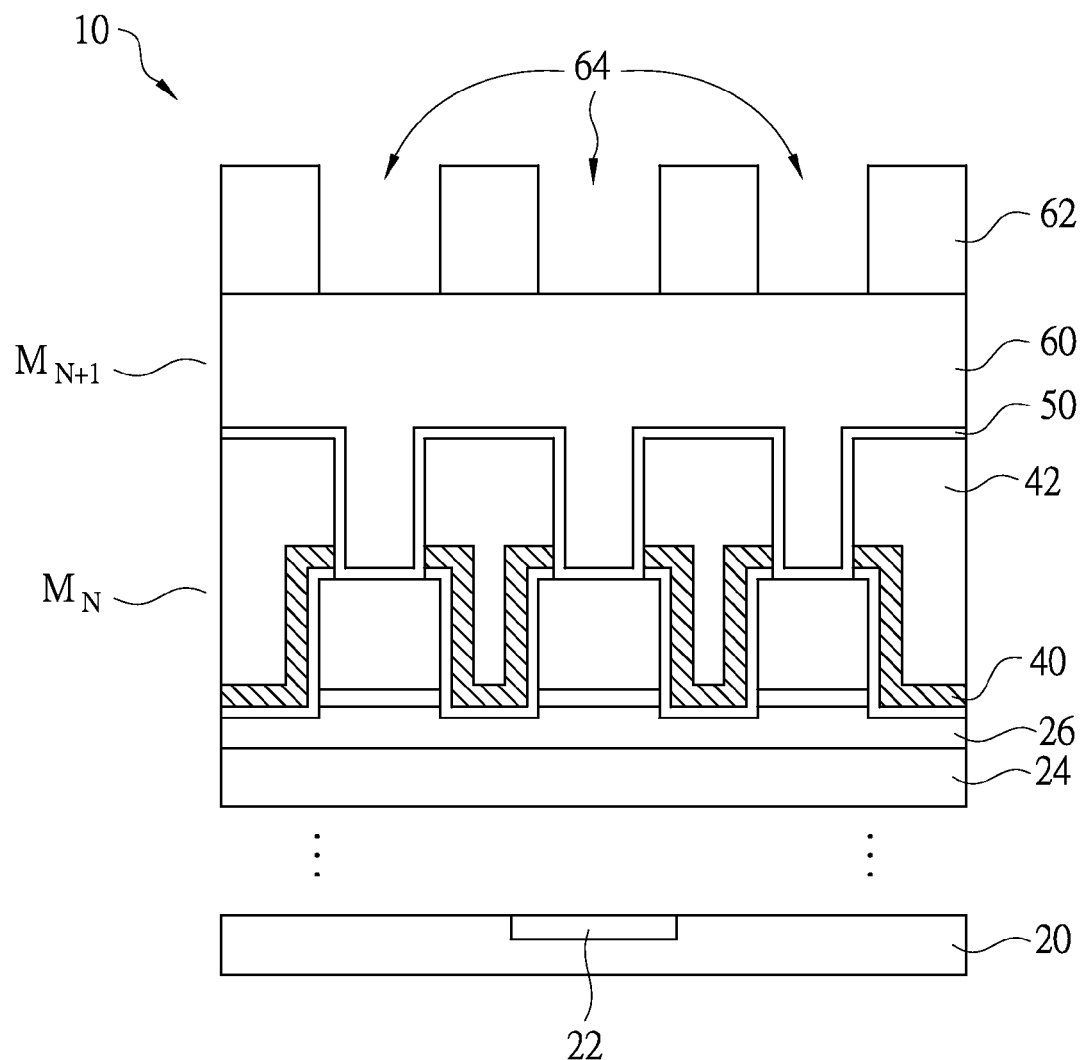

FIG. 8 illustrates the formation of a barrier layer 50 and a conductive layer 60 in the openings 48 contacting the top surfaces of the conductive lines 36 and along a top surface 42A of the second dielectric layer 42. The barrier layer 58 may be similar to the barrier layer 28 described above and the description will not be repeated herein. The conductive layer 60 may be similar to the conductive layer 30 described above and the description will not be repeated herein, although conductive layers 60 and 30 need not be the same. In some embodiments, the portion of the conductive layer 60 formed in the openings 48 contacting the top surfaces of the conductive lines 36 and below the top surface 42A of the second dielectric layer may be referred to as vias.

Figure 9:
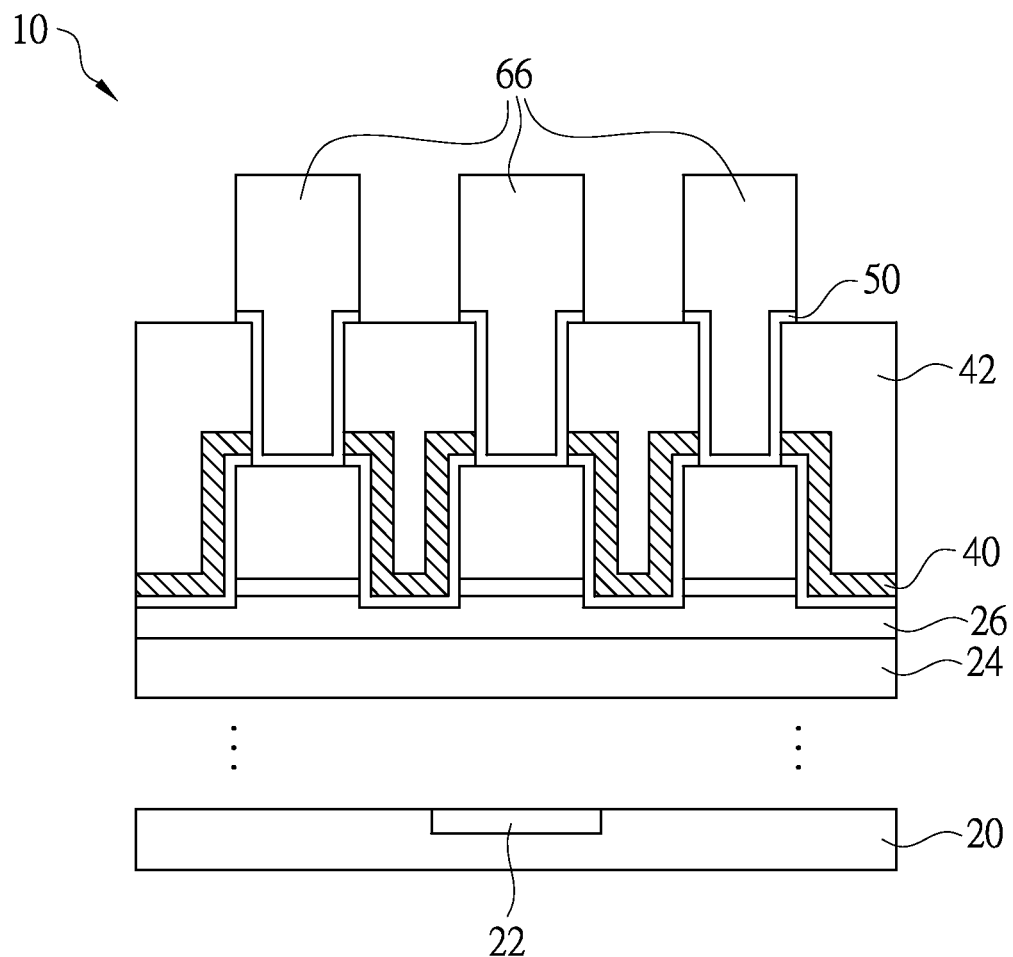

After the conductive layer 60 is formed, the barrier layer 58 and the conductive layer 60 may be patterned (step 214) to form conductive lines 66 as illustrated in FIGS. 8 and 9. A photoresist 62 may be deposited and patterned over the conductive layer 60 to form openings 64 exposing portions of the conductive layer 60 in the openings 64. The photoresist 62 may be formed and patterned similar to the photoresist 32 as described above and the description will not be repeated herein.

After the photoresist 32 is patterned, the conductive layer 60 and the barrier layer 58 may be patterned to expose a top surface of the second dielectric layer 42 as illustrated in FIG. 9. The patterning of the conductive layer 60 forms conductive lines 66. The formation of the conductive lines 66 may be similar to the formation of the conductive lines 36 described above and the description will not be repeated herein, although the formation of conductive lines 66 and 36 need not be the same.

After the formation of the conductive lines 66, a barrier layer 70 may be formed on top surfaces and sidewalls of the conductive lines 66 and the top surface of the second dielectric layer 42 (step 216) as illustrated in FIG. 10. The barrier layer 70 may be similar to the barrier layer 38 described above and the description will not be repeated herein.

After the barrier layer 70 is formed, a third dielectric layer 72 may be formed on the barrier layer 70 (step 218) as illustrated in FIG. 11. The third dielectric layer 72 may help to block the diffusion of the conductive lines 66 into the subsequently formed fourth dielectric layer 74. Further, the third dielectric layer 72 may have a lower etch rate to assist in etch control. The third dielectric layer 72 may be similar to the first dielectric layer 40 described above and the description will not be repeated herein, although the third dielectric layer 72 and the first dielectric layer 40 need not be the same.

After the third dielectric layer 72 is formed, the fourth dielectric layer 74 may be formed on the third dielectric layer 72 (step 220) as illustrate in FIG. 11. The fourth dielectric layer 74 may help to fill gaps between the conductive lines 66 and prevent air gaps in the dielectric layers. The fourth dielectric layer 74 may be similar to the second dielectric layer 42 described above and the description will not be repeated herein, although the fourth dielectric layer 74 and the second dielectric layer 42 need not be the same.

The third and fourth dielectric layers 72 and 74 create a hybrid XLK scheme of forming a dielectric material over the conductive lines 66. They have similar properties and advantages as the first and second dielectric layers 40 and 42 hybrid XLK scheme and the description will not be repeated herein.

The number of conductive lines 36 and 66 and metal layers $M_N$ are only for illustrative purposes and are not limiting. There could be any suitable number conductive lines 36 and 66 and metal layers $M_N$. For example, there could be two more metal layers $M_{N+2}$ and $M_{N+3}$ formed over the metal layer $M_{N+1}$ and formed in a similar manner as described above. Further, there may be devices, structures, and/or connectors formed over and electrically coupled to the metal layers $M_N$ through $M_{N+X}$ and the active and passive devices 22 to form functional circuitry.

Figure 13:
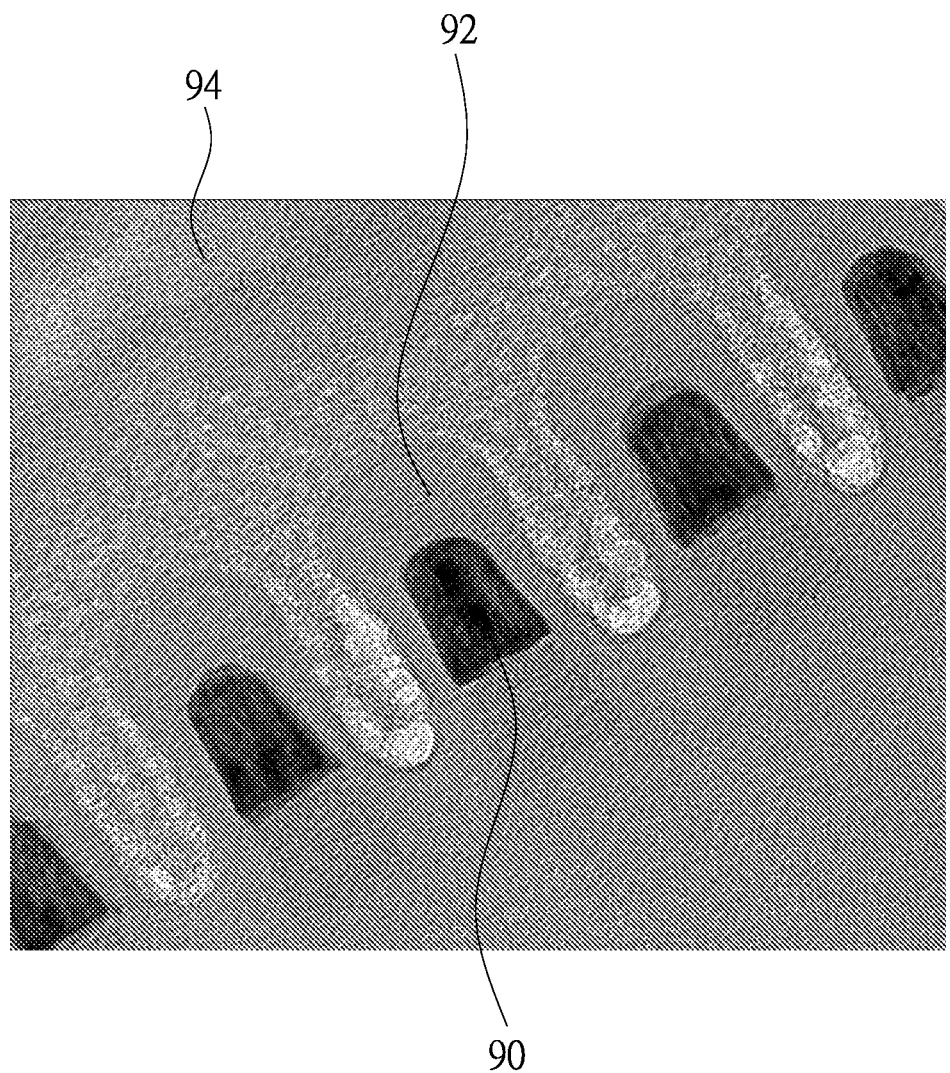
FIG. 13 is an example of a TEM cross section of a semiconductor device in accordance with an embodiment.

FIG. 13 is an example of a TEM cross section of a semiconductor device having a hybrid XLK in accordance with an embodiment. A dielectric layer 92 (similar to the first and third dielectric layers 40 and 72) is on the top surfaces and sidewalls of conductive lines 90 (similar to conductive lines 36 and 66). Dielectric layer 94 (similar to the second and fourth dielectric layers 42 and 74) is on the dielectric layer 92 filling in gaps between the conductive lines 90.

It has been found that having a hybrid XLK scheme to forming a dielectric material over the conductive lines reduces the diffusion of the conductive lines and improves the gap filling properties of the dielectric material. The first dielectric layer (40 and/or 72) being conformally deposited by CVD allows for a smaller pore size to help prevent diffusion of the metal features, and the second dielectric layer (42 and/or 74) being formed by a spin-on process has better gap filling properties to help prevent air gaps between and surrounding the metal features. Thus, the hybrid XLK scheme may allow for a lower effective k value while also preventing integration issues as the feature sizes continue to get smaller.

It has also been found that the reduction in the spacing and the pitch of the metal lines in semiconductor devices has intensified the metal diffusion issues between closely spaced adjacent metal lines that was not an issue in devices with larger spacings and pitches. Thus, this more costly and cumbersome hybrid XLK scheme was not necessary in previous devices with larger spacings and pitches.

An embodiment is a method of forming a semiconductor device, the method comprising forming a first conductive line over a substrate, and conformally forming a first dielectric layer over a top surface and a sidewall of the first conductive line, the first dielectric layer having a first porosity percentage and a first carbon concentration. The method further comprises forming a second dielectric layer on the first dielectric layer, the second dielectric layer having a second porosity percentage and a second carbon concentration, the second porosity percentage being different from the first porosity percentage, and the second carbon concentration being less than the first carbon concentration.

Another embodiment is a method of forming a semiconductor device, the method comprising forming a first barrier layer over a substrate, forming a first metal layer on the first barrier layer, patterning the first metal layer and the first barrier layer into a first plurality of metal lines, wherein each of the first plurality of metal lines is coterminous with a section of first barrier layer, and conformally forming a second barrier layer over top surfaces and sidewalls of the first plurality of metal lines. The method further comprises forming a first dielectric layer on the second barrier layer, the first dielectric layer having a first porosity percentage and a first carbon concentration, and forming a second dielectric layer on the first dielectric layer, the second dielectric layer having a second porosity percentage and a second carbon concentration, the second porosity percentage being different from the first porosity percentage, and the second carbon concentration being less than the first carbon concentration.

A further embodiment is a semiconductor device comprising a first metal line over a substrate, a second metal line over the substrate, the second metal line laterally spaced from the first metal line, and a first dielectric layer having a substantially constant thickness over the first metal line and the second metal and extending between the first metal line and the second metal line, the first dielectric layer having a first porosity percentage and a first carbon concentration. The semiconductor device further comprises a second dielectric layer on the first dielectric layer, the second dielectric layer having a portion extending between the first metal line and the second metal line, the second dielectric layer having a second porosity percentage and a second carbon concentration, the second porosity percentage being different from the first porosity percentage, and the second carbon concentration being different from the first carbon concentration.

Although the present embodiments and their advantages have been described in detail, it should be understood that various changes, substitutions, and alterations can be made herein without departing from the spirit and scope of the disclosure as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of forming a semiconductor device, the method comprising:
   forming a first conductive line and a second conductive line over a substrate;
   conformally forming a barrier layer along sidewalls and a top surface of the first conductive line, along sidewalls and a top surface of the second conductive line, and extending from the first conductive line to the second conductive line;
   conformally forming a first dielectric layer on the barrier layer, the first dielectric layer having a first porosity percentage and a first carbon concentration;
   forming a second dielectric layer on the first dielectric layer, the second dielectric layer having a second porosity percentage and a second carbon concentration, the second porosity percentage being different from the first porosity percentage, and the second carbon concentration being less than the first carbon concentration; and
   before the forming a first conductive line and a second conductive line, forming an etch stop layer over the substrate, the first conductive line and second conductive line being formed on the etch stop layer, at least the portion of the barrier layer extending from the first conductive line to the second conductive line is contacting a surface of the etch stop layer.

2. The method of claim 1, wherein the first dielectric layer has a pore size from about 3 Å to about 20 Å and the second dielectric layer has a pore size from about 10 Å to about 40 Å.

3. The method of claim 1, wherein the first dielectric layer has a dielectric constant value from about 2.2 to about 2.9 and the second dielectric layer has a dielectric constant value from about 1.8 to about 2.4.

4. The method of claim 1, wherein the conformally forming the first dielectric layer further comprises performing a chemical vapor deposition process, and wherein the forming the second dielectric layer further comprises performing a spin-on-dielectric process.

5. The method of claim 1, wherein the second porosity percentage is greater than the first porosity percentage.

6. The method of claim 1 further comprising:
   etching an opening through the second dielectric layer and the first dielectric layer, the opening extending to the top surface of the first conductive line; and
   forming a second conductive line coupled to the first conductive line through the opening.

7. The method of claim 1, wherein the first conductive line comprises copper.

8. A method of forming a semiconductor device, the method comprising:
   forming a first barrier layer over a substrate;
   forming a first metal layer on the first barrier layer;
   patterning the first metal layer and the first barrier layer into a first plurality of metal lines, wherein sidewalls of each of the first plurality of metal lines is coterminous with sidewalls of a section of first barrier layer;
   conformally forming a second barrier layer over top surfaces and sidewalls of the first plurality of metal lines and extending over the substrate from one of the first plurality of metal lines to an adjacent one of the first plurality of metal lines;
   forming a first dielectric layer on the second barrier layer, the first dielectric layer having a first porosity percentage and a first carbon concentration; and
   forming a second dielectric layer on the first dielectric layer, the second dielectric layer having a second porosity percentage and a second carbon concentration, the second porosity percentage being different from the first porosity percentage, and the second carbon concentration being less than the first carbon concentration.

9. The method of claim 8 further comprising:
   forming an interlayer dielectric on the substrate; and
   forming an etch stop layer on the interlayer dielectric, the first barrier layer being formed on the etch stop layer.

10. The method of claim 8, wherein the forming the first dielectric layer further comprises performing a chemical vapor deposition process, and wherein the forming the second dielectric layer further comprises performing a spin-on-dielectric process.

11. The method of claim 8, wherein a portion of the second dielectric layer is laterally between at least two of the first plurality of metal lines, the at least two being adjacent metal lines.

12. The method of claim 8, wherein adjacent metal lines of the plurality of metal lines are separated by a first spacing, the first spacing being in a range from about 5 nm to about 50 nm.

13. The method of claim 8, wherein the first carbon concentration is from about 10% to about 40%, and wherein the second carbon concentration is from about 1% to about 20%.

14. The method of claim 8 further comprising:
   forming a plurality of openings to top surfaces of the plurality of metal lines;
   forming a third barrier layer in the plurality of openings;
   forming a second metal layer on the third barrier layer;
   patterning the second metal layer and the third barrier layer into a second plurality of metal lines, wherein each of the second plurality of metal lines is coterminous with a section of the third barrier layer;
   conformally forming a fourth barrier layer over top surfaces and sidewalls of the second plurality of metal lines;
   forming a third dielectric layer on the fourth barrier layer, the third dielectric layer having the first porosity percentage and the first carbon concentration; and forming a fourth dielectric layer on the third dielectric layer, the fourth dielectric layer having the second porosity percentage and the second carbon concentration.

15. The method of claim 8, wherein the second barrier layer contacts sidewalls of the sections of the first barrier layer.

16. A method comprising:
   forming a first metal line and a second metal line over a substrate, the second metal line being adjacent the first metal line;
   conformally forming a first dielectric layer over top surfaces and sidewalls of the first metal line and the second metal line, the first dielectric layer having a first porosity percentage, the conformally forming the first dielectric layer comprising:
      forming a first silicon oxide layer; and
      doping the first silicon oxide layer with carbon to a first carbon concentration, the first carbon concentration being from about 10% to about 40%; and
   forming a second dielectric layer on the first dielectric layer, a portion of the second dielectric layer being between sidewalls of the first metal line and the second metal line, the second dielectric layer having a second porosity percentage, the forming the second dielectric layer comprising:
      forming a second silicon oxide layer; and
      doping the second silicon oxide layer with carbon to a second carbon concentration, the second carbon concentration being less than the first carbon concentration, the second carbon concentration being from about 1% to about 20%.

17. The method of claim 16, wherein the forming the first silicon oxide layer further comprises performing a chemical vapor deposition process, and wherein the forming the second silicon oxide layer further comprises performing a spin-on-dielectric process.

18. The method of claim 16 further comprising:
   etching an opening through the second dielectric layer and the first dielectric layer, the opening extending to the top surface of the first metal line; and
   forming a third metal line coupled to the first metal line through the opening.

19. The method of claim 16, wherein the first metal line and the second metal line are separated by a first spacing, the first spacing being in a range from about 5 nm to about 50 nm.

20. The method of claim 16 further comprising:
   wherein the forming the first metal line and the second metal line further comprises:
      forming a first barrier layer over the substrate;
      forming a first metal layer on the first barrier layer;
      patterning the first metal layer and the first barrier layer into the first metal line and the second metal line, wherein each of the first metal line and the second metal line is coterminous with a section of first barrier layer; and
   conformally forming a second barrier layer over top surfaces and sidewalls of the first metal line and the second metal line, the first dielectric layer being on the second barrier layer.

* * * * *